United States Patent
Kobayashi et al.

(10) Patent No.: US 6,511,588 B1
(45) Date of Patent: Jan. 28, 2003

(54) PLATING METHOD USING AN ADDITIVE

(75) Inventors: Kinya Kobayashi, Hitachi (JP); Akihiro Sano, Hitachi (JP); Takeyuki Itabashi, Hitachi (JP); Toshio Haba, Hitachi (JP); Haruo Akahoshi, Hitachi (JP); Shinichi Fukada, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/545,093

(22) Filed: Apr. 7, 2000

(30) Foreign Application Priority Data

Sep. 20, 1999 (JP) .......................... 11-264999

(51) Int. Cl.$^7$ .............................. C25D 3/02; C25D 7/12
(52) U.S. Cl. ..................... 205/81; 205/123; 205/149; 205/150; 205/157; 205/261; 205/296; 205/297; 205/298
(58) Field of Search ................... 205/81, 123, 149, 205/150, 157, 261, 296, 297, 298

(56) References Cited

U.S. PATENT DOCUMENTS

| | | | |
|---|---|---|---|
| 6,024,857 A | * | 2/2000 | Reid ........................ 205/123 |
| 6,113,771 A | * | 9/2000 | Landau et al. ............... 205/123 |
| 6,210,555 B1 | * | 4/2001 | Taylor et al. ............... 205/103 |

FOREIGN PATENT DOCUMENTS

| | | |
|---|---|---|
| JP | 2-104690 | 4/1990 |
| JP | 4-358091 | 12/1992 |

OTHER PUBLICATIONS

Andricacos, et al., "Damascene Copper Electroplating For Chips Interconnections", in IBM J. Res. Develop., vol. 42, No. 5, Sep. 1998, pp. 567–574.

* cited by examiner

*Primary Examiner*—Nam Nguyen
*Assistant Examiner*—William T. Leader
(74) *Attorney, Agent, or Firm*—Antonelli, Terry, Stout & Kraus, LLP

(57) ABSTRACT

A plating method comprising using a plating solution containing an additive satisfying the following conditions:

$$0.005 \times h^2/w < D/\kappa < 0.5 \times h^2/w,$$

and $$0.01 \leq \Theta \leq 0.7$$

wherein D is a diffusion coefficient of the additive; $\kappa$ is a surface reaction rate of adsorption or consumption of the additive; h is a height of a trench or hole; w is the width of the trench or the radius of the hole; and $\Theta$ is a ratio of (plating film growth rate in the presence of additive)/(plating film growth rate in the absence of additive), is suitable for forming the plating metal in the trench or hole having the width of 1 $\mu$m or less (trench) or the radius of 1 $\mu$m or less (hole) without generating voids, and particularly suitable for producing semiconductor devices, which can have a multi-layer structure of copper wiring layers formed on a semi-conductor substrate by using the plating conditions, wherein at least one layer of copper wiring layers is plated in different conditions from the rest of the copper wiring layers.

7 Claims, 7 Drawing Sheets

ADDITIVE 12ppm

ADDITIVE 1ppm

ADDITIVE 12ppm

ADDITIVE 1ppm

PLATING METHOD USING AN ADDITIVE

BACKGROUND OF THE INVENTION

The present invention relates to a plating method, a plating solution, a semiconductor device and process for producing the device. In more particular, it relates to a plating method and a plating solution used in producing semiconductor devices having wiring and holes, to a process for producing a semiconductor device and to a semiconductor device produced by using them.

A known technology used for copper plating wiring and filling thereof into a semiconductor device in a process reported in "Demacene copper electroplating for chip interconnections", P. C. Andricacos et al., IBM Research Development pp. 567–573, Vol. 42, No. 5, September 1998 (the first known technique) which comprises making copper grow selectively from the bottom of a hole or a trench by utilizing an additive thereby to fill the hole or the trench.

With regard to copper plating which utilizes an additive, there are known JP-A 2-104690 and JP-A 4-358091.

To attain a high speed operation of the integrated circuit of a semiconductor device, it has become of essential importance to develop a method for decreasing the wiring resistance, more specifically, to develop a process which utilizes copper wiring of low resistance in place of aluminum wiring previously used. With regard to the plating technique for copper wiring and hole filling, at present, the electroplating technique is the most promising candidate from the viewpoints of cost and filling characteristics. When the width of a hole or a trench to be filled by copper plating is small, seams or voids are apt to be generated in the copper film, resulting in an increase of resistance.

To avoid this difficulty, there has been disclosed a plating method in which an additive capable of deterring copper plating is added into the plating solution, whereby copper is grown preferentially from the bottom of the hole and the generation of seams and voids is prevented (a first known technique).

However, the generation of voids and seams in the hole and trench cannot be predicted simply from the characteristic properties of the additive. Therefore, there has been a disadvantage in that the filling performance of a plating solution has to be judged from the shape of the filled product obtained by actually filling a hole or trench by a plating method using a plating solution containing an additive material. Further, it has been necessary to develop and optimizing a plating solution every time the shape of the hole or trench changes.

Furthermore, the filling characteristics of a plating solution sometimes change with the lapse of time. To suppress the change, it is necessary to monitor the filling characteristics of the plating solution.

On the other hand, JP-A 2-104690 and JP-A 4-358091 aim at depositing copper plating uniformly with through holes as the object, so that they are different from the present invention in the object and the aim.

BRIEF SUMMARY OF THE INVENTION

One object of the present invention is to provide a plating method which uses a plating solution containing an additive having characteristic property conditions corresponding to the intended system, a plating solution containing the additive, a process for producing a semi-conductor device and a semiconductor device produced by the process. As a result, the generation of voids and seams can be deterred. Another object of the present invention is to specify the physical quantities to be determined with regard to filling characteristics thereby to deter the change of filling characteristics with time.

According to the present invention, there is provided a plating method which comprises, adding an additive which hinders growth of plating metal film to a plating solution so as to satisfy the following conditions:

$$0.005 \times h^2/w < D/\kappa < 0.5 \times h^2/w$$

wherein D is a diffusion coefficient (m²/sec) of the additive; κ is a surface reaction rate (m/sec) of adsorption or consumption of the additive; h is a height (m) of a trench or hole; and w is the minimum width (m) of the trench or the minimum radius (m) of the hole, and $$0.01 \leq \Theta \leq 0.7$$

wherein Θ is a ratio of (plating film growth rate in the presence of additive)/(plating film growth rate in the absence of additive), or (plating current in the presence of additive)/(plating current in the absence of additive) at the same plating potential, in the case of filling the trench having the width of $10^{-6}$ m or less, or the hole having the radius of $10^{-6}$ m or less, and forming the plating metal in the trench or hole.

According to the present invention, there are further provided a plating solution used in the above-mentioned plating method, a process for producing a semiconductor device using the plating method and the plating solution, and a semiconductor device thus obtained, said semiconductor device being able to have a multilayer structure of copper wiring layers formed on a semiconductor substrate by using the above-mentioned plating solution for forming each layer.

DETAILED DESCRIPTION OF THE INVENTION

The plating method of the present invention is characterized, in a step of forming a plated metal in a trench having a height of h (m) and the width of w (m) or a hole having the radius of w (m), for filling, by the above-mentioned formation of the plating film, a trench having the minimum width of 1 $\mu$m ($10^{-6}$ m) or less or a hole having a radius of 1 $\mu$m ($10^{31\ 6}$ m) or less, by using a plating solution incorporated with an additive (a material which hinders plating film growth when added to the plating solution) which satisfies the following inequality:

$$0.005 \times h^2/w < D/\kappa < 0.5\ h^2/w$$

and the condition that, at the same plating potential, the ratio (plating film growth rate in the presence of additive)/(plating film growth rate in the absence of additive) or (plating current in the presence of additive)/(planting current in the absence of additive)=$\Theta$ should be not less than 0.01 and not more than 0.7, D being the diffusion coefficient ($m^2$/sec) of the additive, $\kappa$ being the reaction rate (m/sec) of adsorption or consumption of the additive at the surface, and D/$\kappa$ being the ratio of the two.

The present invention is further characterized in that, for filling with plating metal, a trench having the width of 0.2 $\mu$m ($0.2 \times 10^{-6}$ m) or less or a hole having the radius of 0.2 $\mu$m ($0.2 \times 10^{-6}$ m) or less, the plating solution contains an additive which satisfies the following inequality:

$$0.05 \times h^2/w < D/\kappa < 0.2 \times h^2/w;$$

and is additionally characterized in that the plating solution contains an adhesive which satisfies the condition that, at the same plating potential, $\kappa$ should be not more than 0.3 and not less than 0.1.

The present invention is further characterized by monitoring D, $\kappa$ and $\Theta$ continuously or intermittently and controlling the amount of the additive added so that D/$\kappa$ and $\Theta$ may fall within the specified ranges, $0.005 \times h^2/w < D/\kappa < 0.5 \times h^2/w$, and $0.01 \leq \Theta \leq 0.7$, respectively.

The present invention is still further characterized in that the reaction rate constant of the additive is determined based on the electrochemical reaction rate of the additive on the electrode surface constituted of the metal to be plated.

The present invention further provides a plating solution containing at least one additive described in the above-mentioned invention and a semiconductor device produced by using the plating film forming method described in the above-mentioned invention.

Figure 3:
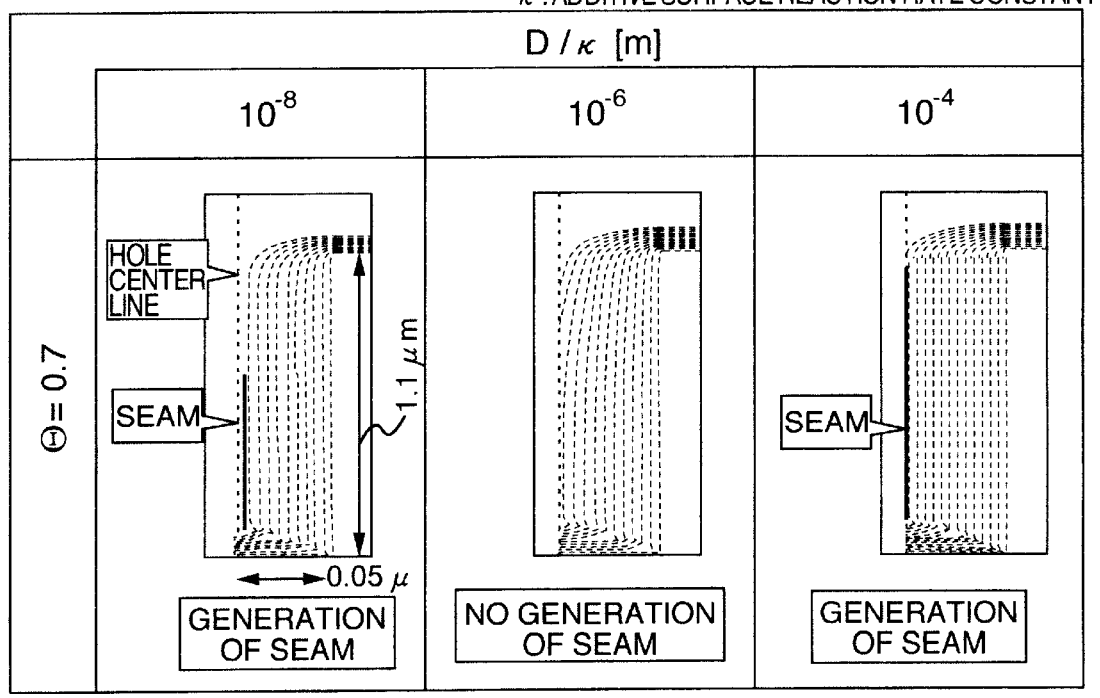
FIG. 3 is a drawing showing the dependency of the filling shape of a hole having a radius of 0.05 μm and a height of 1.1 μm on the ratio, D (diffusion coefficient of additive)/κ (surface reaction rate of additive), wherein Θ= (plating current in the presence of additive)/(plating current in the absence of additive) is 0.7, in one example of the present invention.

In a step of forming a plated metal in a trench having a height of h (m) and the width of w (m), when the diffusion coefficient ($m^2$/sec) of a material which hinders the plating metal film formation when added to the plating solution (additive) is designated as D and the reaction rate (m/sec) of adsorption or consumption of the additive is designated as $\kappa$, by using an additive having D and $\kappa$ which are in the range of $0.005 \times h^2/w < D$(diffusion coefficient)/$\kappa$ (surface reaction rate) $< 0.5 \times h^2/w$ and using corresponding film forming conditions, the concentration of the additive comes to have a distribution of a range shown in FIG. 3. By attaining such a distribution, the generation of voids and seams at the bottom part which might be caused by extreme localization of the additive to the inlet part alone can be avoided. Further, since the additive does not spread uniformly in the hole or trench, the generation of seam which might be caused by such a factor can also be avoided.

Additionally, by fulfilling the condition that, at the same plating potential, (plating film growth rate in the presence of additive)/(plating film growth rate in the absence of additive) or (plating current in the presence of additive)/(plating current in the absence of additive)=$\Theta$ should be not less than 0.01 and not more than 0.7, plated metal free from voids and seams can be obtained.

The above-mentioned D, $\kappa$ and $\Theta$ can, in many cases, be determined by electrochemical techniques. For the determination of D, the microelectrode method is useful. As an example, a case is described below wherein the improvement of the hole and trench filling characteristic of a plating solution is intended by adding an additive A to a copper plating solution comprising $CuSO_4 \cdot 5H_2O$ (70 g/l), $H_2SO_4$ (50 ml/l) and $Cl^-$ (60 ppm).

To a solution obtained by excluding copper sulfate from the above-mentioned copper plating solution (that is, a solution comprising $H_2SO_4$ (50 ml/l) and $Cl^-$ (60 ppm)) is added 2 mmol/l(=$2 \times 10^3$ mol/l) of the additive A, and the resulting solution is used as the measuring solution. Determination is conducted using an Ag/AgCl electrode as the reference electrode, a Pt electrode as the opposite electrode and a Pt micro-electrode of about 15 $\mu$m$\phi$ as the working electrode (measuring electrode). The range of potential to be measured is within bounds wherein neither the decomposition reaction of water of the measuring solvent nor the chlorine gas generation reaction due to the oxidation of a trace amount of added chloride ion takes place on the working electrode, and is usually +1.0 to $-0.3$ V (vs. Ag/AgCl). When the additive A is an electrochemically active substance and undergoes oxidation-reduction reaction in the above-mentioned potential range, D can be determined from the value of the electric current observed. The absolute value I of the current measured is given by the formula $$I = 4nFCDa$$

by using the reaction electron number n, Faraday constant F, concentration C (mol/$m^3$) and working electrode radius "a" (m). By using the formula, the diffusion coefficient D can be determined from the measured value of electric current. The reaction electron number herein can be separately determined electrochemically (see, for example, Denki-kagaku Sokuteiho (measuring methods in electrochemistry), Volume One, pp. 150–168, published by Gihodo Shuppan K.K., 1984).

When the additive is electrochemically not active, D may be determined by the isotope method or other suitable means.

Figure 4:
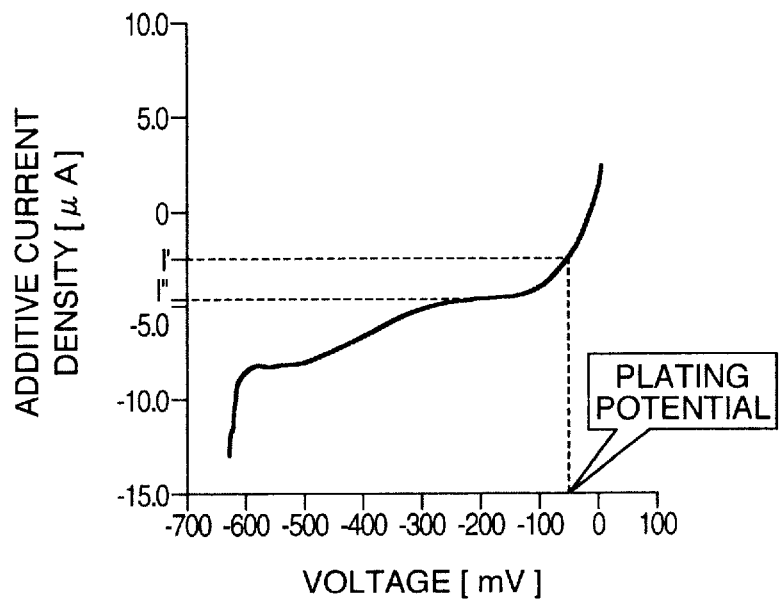
FIG. 4 is a graph showing the current vs. voltage curve determined for the additive molecule, Janus Green B, on the copper surface in one example of the present invention.

The reaction rate $\kappa$ can be determined electrochemically by using a Cu electrode of about 3 mm$\phi$. The same plating solution is assumed as in the determination of D. First, with the plating solution used as the measuring solution, the reaction potential (plating potential) of the Cu electrode at the current density at which plating is actually to be conducted is determined. Then, as the measuring solution is used a solution obtained by adding 2 mol/l(=2×10$^{-3}$ mol/l) of the additive A to a solution, which comprises $H_2SO_4$ (50 ml/l) and Cl$^-$ (60 ppm), resulting from exclusion of copper sulfate from the copper plating solution. A stationary polarization curve is determined in the neighborhood of the plating potential on the Cu electrode which has been determined beforehand and at a sufficiently low potential scanning velocity. The absolute value of electric current with which the additive A is stationarily reduced or oxidized on the Cu electrode at the plating potential is designated as I'(A) (see FIG. 4). When the absolute value of current at which the current curve becomes approximately flat for the first time on the side wherein the absolute value is larger than the plating potential in the above-mentioned determination is designated as I"(A), κ can be obtained from the following equation by using I'(A), I"(A), concentration C, Faraday's constant F, electrons transferred n, and the area of the Cu electrode, S.

$$\kappa = 1/\{(FnC/I' - FnC/I'') \times S\}$$

For obtaining Θ, first the plating potential is determined beforehand for a case wherein a desired amount of the additive A has been added to a copper plating solution comprising $CuSO_4 \cdot 5H_2O$ (70 g/l), $H_2SO_4$ (50 ml/l) and Cl$^-$ (60 ppm). Thereafter, a current value is determined with a copper plating solution comprising $CuSO_4 \cdot 5H_2O$ (70 g/l), $H_2SO_4$ (50 ml/l) and Cl$^-$ (60 ppm) resulting from exclusion of the additive A from the copper plating solution mentioned before and at a plating potential determined beforehand. Then Θ is obtained by calculating the ratio of the current in the presence of additive to the current in the absence of additive.

Θ=(plating current in the presence of additive)/(plating current in the absence of additive)

Figure 5:
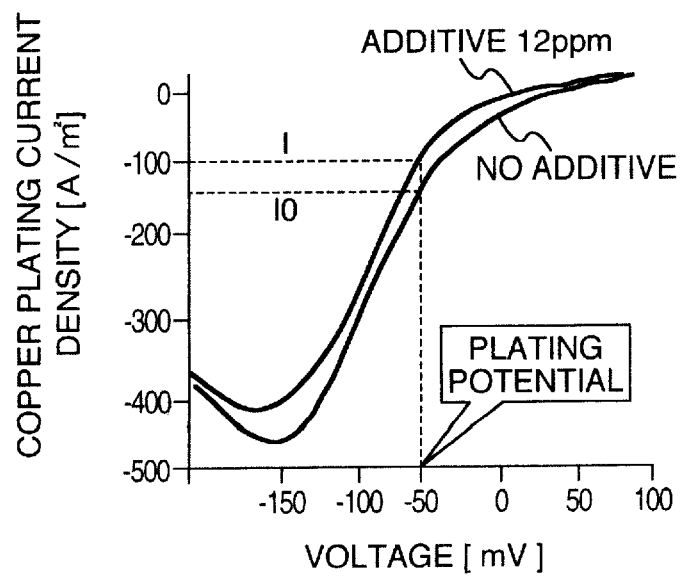
FIG. 5 is a graph showing the copper plating current vs. voltage curves determined in a case wherein a plating solution used contained an additive, Janus Green B, in a concentration of 12 ppm and a case wherein the solution contained no additive, in one example of the present invention.

In the current-voltage curve of FIG. 5, Θ is obtained by Θ=I/Io.

As the additive, there can be used those satisfying the above-mentioned ranges of D/κ and Θ.

Preferable examples of the additives are as follows:

Janus Green B:

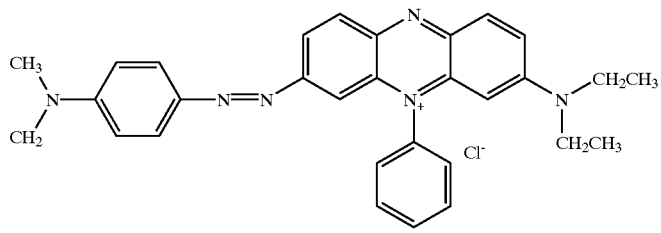

Basic Blue 3:

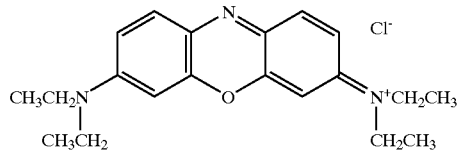

Diazine Black:

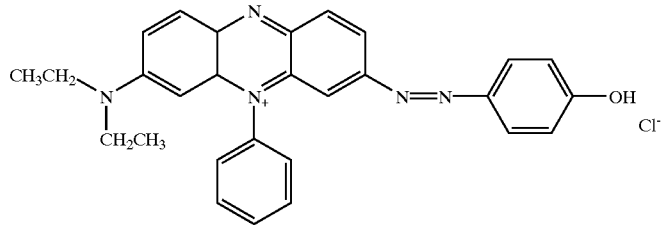

Methyl Violet 2B:

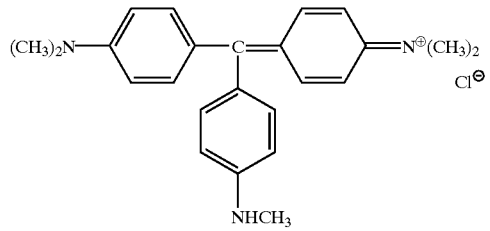

Tetranitro Blue Tetrazolium chloride hydrate:

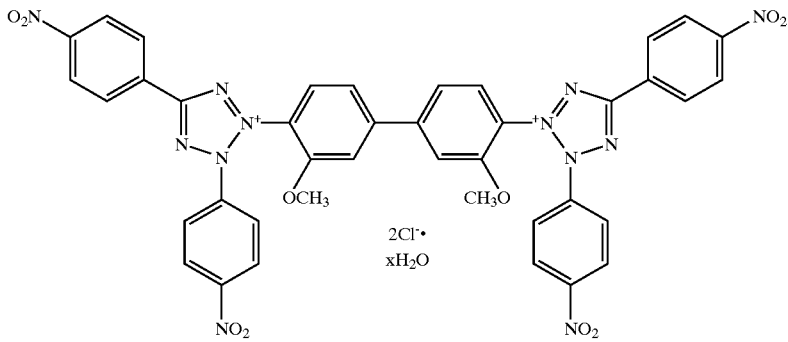

2,3,5-Triphenyl-2H-tetrazolium chloride:

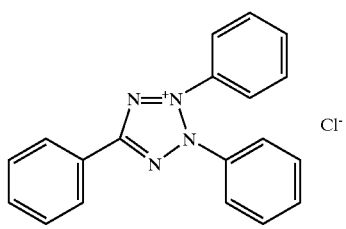

Basic Red 12:

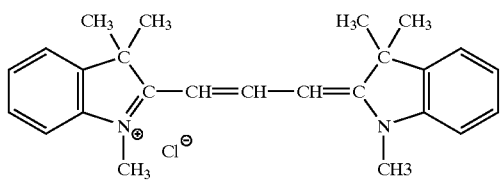

Safranin O:

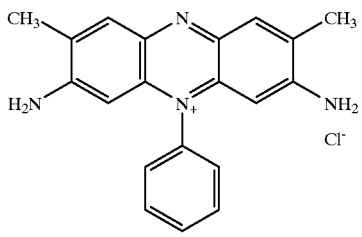

In the Examples of the present invention, by selecting D, κ and Θ in the specified ranges, a plating solution and a plating method which are capable of filling a trench having a width of 1 μm or less or a hole having a radius of 1 μm or less are provided. Although specific substances are exemplified in the following Examples, they are merely for the sake of illustration and the present invention can be practiced also with other substances than exemplified below so long as D, κ and Θ fall within the ranges specified by the invention.

Furthermore, when such physical properties of an additive in the plating solution as D, κ and Θ can be determined, and the shape of the hole or trench of the objective substrate, copper ion concentration, electric conductivity of solvent, relation between current and voltage, and current density are specified, it becomes possible to simulate the process of the growth of plating film under certain plating conditions. In this simulation, the plating film growth rate at respective positions of a trench or hole can be calculated by the electric field analysis and the compound analysis of the diffusion equation of the copper ion and the diffusion equation of the additive. In the present invention, accordingly, sometimes the effect of Example is verified by using the result of simulation.

The present invention also provides a process for producing a semiconductor device comprising a step of forming a plating metal in a trench having the minimum width (w) of $10^{-6}$ m or less, or a hole having the minimum radius (w) of $10^{-6}$ m or less, the improvement wherein there is used a plating solution containing an additive which satisfies the following conditions:

$$0.005 \times h^2/w < D/\kappa < 0.5 \times h^2/w$$

wherein D is a diffusion coefficient ($m^2$/sec) of the additive; κ is a surface reaction rate (m/sec) of adsorption or consumption of the additive; h is a height (m) of the trench or hole; and w is the minimum width (m) of the trench or the minimum radius (m) of the hole, and $$0.01 \leq \Theta \leq 0.7$$

wherein Θ is a ratio of (plating film growth rate in the presence of additive)/(plating film growth rate in the absence of additive), or (plating current in the presence of additive)/(plating current in the absence of additive), at the same plating potential.

In the present invention, it is also possible to produce a semiconductor device having a multilayer structure comprising forming a plurality of copper wiring layers on a semiconductor substrate, using the plating solution mentioned above, wherein at least one layer of copper wiring layers is plated in different conditions from the rest of copper wiring layers, e.g. each copper wiring layer having different minimum width of a trench or different minimum radius of a hole w and being formed respectively by using a plating solution containing an additive which satisfies the following conditions:

$$0.05 \times h^2/w < D/\kappa < 0.2 \times h^2/w.$$

wherein D, κ, h and w are as defined above, for each copper wiring layer.

The semiconductor device thus obtained has individual copper wiring layers more excellent in filling properties compared with the case of using one kind of plating solution.

In this case, the copper wiring is formed by copper plating. Further, at least one copper wiring layer has an element or amount ratio thereof or both in copper wiring different from the rest of copper wiring layers. The amount ratio of element can be obtained by changing the plating conditions, said plating conditions dependent on at least one of a composition of a plating solution, a concentration of additive and/or copper in the plating solution, a current density and a flow rate of plating solution.

The present invention is further described in detail below with reference to Examples.

The following plating solution and evaluation substrate were used in the Examples.

The "plating solution" comprises the following: $CuSO_4 \cdot 5H_2O$ (75 g/l), $H_2SO_4$ (109 ml/g), $Cl^-$ (60 ppm).

Additives used in the Examples: a variety of additives were used in various concentrations according to necessity.

The "evaluation substrate" is a silicon substrate in which a hole or a trench (details being described below) has been provided to the insulation layer by ion etching, a tantalum layer of 50 nm thickness has been formed by sputtering as the copper diffusion preventive layer and a copper layer of 100 nm thickness has been formed by sputtering as the seed layer of electrical copper plating, and has a diameter of 8 inches. The hole has a radius at the bottom varied from 0.09 μm to 0.5 μm with an interval of about 0.025 μm, and has a depth of 1.1 μm. The trench has a width varied from 0.18 μm to 1.0 μm with an interval of about 0.05 μm, and has a depth of 1.1 μm.

EXAMPLE 1

Janus Green B was used as the additive and added to the plating solution to a concentration of 12 ppm. The result of determination of the diffusion coefficient using a microelectrode showed that D = $3.86 \times 10^{-10}$ ($m^2$/sec). The reaction rate constant κ was found to be $2.03 \times 10^{-4}$ (m/sec). Therefore, D/κ=$1.9 \times 10^{-6}$ m.

In the evaluation substrate of the present Example, h=$1.1 \times 10^{-6}$ (m) and the minimum width of the trench w=$0.18 \times 10^{-6}$ (m), so that $h^2/w$=$6.72 \times 10^{-6}$, $0.005 \cdot h^2/w$=$3.36 \times 10^{-8}$ and $0.5 \times h^2/w$=$3.36 \times 10^{-6}$. Therefore, the additive used in the present Example, Janus Green B, satisfies the condition range of $$0.005 \times h^2/w < D/\kappa < 0.5 \times h^2/w.$$

Further, since the minimum radius of the hole w is $0.09 \times 10^{-6}$ (m), $0.005 \times h^2/w$=$7.72 \times 10^{-8}$ and $0.5 \times h^2/w$=$7.72 \times 10^{-6}$. Therefore, also in the case of a hole, the condition range of $$0.005 \times h^2/w < D/\kappa < 0.5 \times h^2/w$$

is satisfied.

Figure 7A:
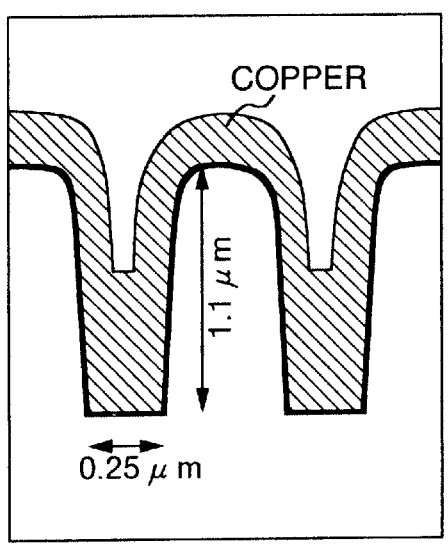
FIGS. 7A and 7B are cross-sectional views of the copper plating filling shape obtained by using a plating solution containing an additive molecule, Janus Green B, in one example of the present invention.

Plating was performed by using the above-mentioned plating solution at a current density of 100 A/$m^2$ for 20 seconds, and the cross-sectional view of the trench part thus obtained is shown in FIG. 7A. As is apparent from the drawing, the copper plating is thick at the bottom of the trench and is thin in the neighborhood of the inlet of the trench. This result reveals that, with the plating solution of the present Example, preferential growth of plating from the trench bottom can be attained.

Further, plating was conducted under the same conditions as above except for changing the plating time to 4 minutes, and 500 holes with respective radii and 200 trenches with respective widths were observed from their sections. Resultantly, voids and streak-formed hollow seams, which develop when filling by plating is insufficient, were not observed at all.

The results obtained above confirm the effect of the present Example that by adding an additive which satisfies the range of $0.005 \times h^2/w < D/\kappa < 0.5 \times h^2/w$ to the plating solution, the preferential growth of the plating metal from the bottom of a hole or trench can be attained and the hole or trench in a substrate can be filled completely without generation of voids, etc.

Comparative Example 1

The same experiment as in Example 1 was conducted except for using Methylene Blue as the additive. The concentration was 12 ppm as in Example 1.

The result of electrochemical determination showed that the diffusion coefficient of Methylene Blue D=$2.64 \times 10^{-10}$ ($m^2$/sec) and the reaction rate constant κ=$0.94 \times 10^{-5}$ (m/sec). Accordingly, D/κ=$2.8 \times 10^{-5}$ m.

With Methylene Blue, in the case of a trench, D/κ is larger than $0.5 \times h^2/w$=$3.36 \times 10^{-6}$ m and hence the range condition, $0.005 \times h^2/w < D\kappa < 0.5 \times h^2/w$, is not satisfied. In the case of a hole, also, D/κ is $0.5 \times h^2/w$=$7.72 \times 10^{31\ 6}$ m, and hence the range condition, $0.005 \times h^2/w < D/\kappa < 0.5 \times h^2/w$, is not satisfied. When the evaluation substrate was plated by using the above-mentioned plating solution at a current density of 100 A/$m^2$ for 20 seconds, preferential growth of plating from the trench bottom could not be attained, and the plating film showed approximately uniform thickness from the inlet to the bottom of the trench.

Further, plating was conducted under the same conditions as above except for changing the plating time to 4 minutes, and 500 holes with respective radii and 200 trenches with respective widths of the evaluation substrate were observed from their sections. Resultantly, voids and streak-formed hollow seams, which develop when filling by plating is insufficient, were observed in nearly all of the holes and trenches. This result revealed that the plating solution and the plating film forming method of the present Comparative Example were not suited for filling holes and trenches. This is because the additive for the plating solution used in the present Comparative Example does not have physical properties which satisfy the range condition, $0.005 \times h^2/w < D/\kappa < 0.5 \times h^2/w$.

EXAMPLE 2

Experiments were carried out by using the same experimental apparatus as in Example 1, using Janus Green B as the additive, and varying Θ=(film growth rate in the presence of additive)/(film growth rate in the absence of additive).

Θ is evaluated as follows. When, at a constant cathode potential, the cathode current in the presence of an additive and the current in the absence of an additive are designated respectively as I and Io, Θ=I/Io. From FIG. 5, when the concentration of the additive is 12 ppm, Θ is read off as 0.66. When the additive concentration is 1 ppm, Θ is 0.99.

Figure 6A:
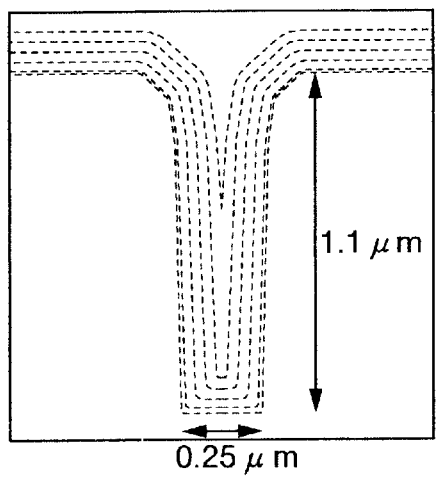
FIGS. 6A and 6B are drawings showing the results of simulation of the copper plating filling shape using a plating solution containing an additive molecule, Janus Green B, in one example of the present invention.
Figure 6B:
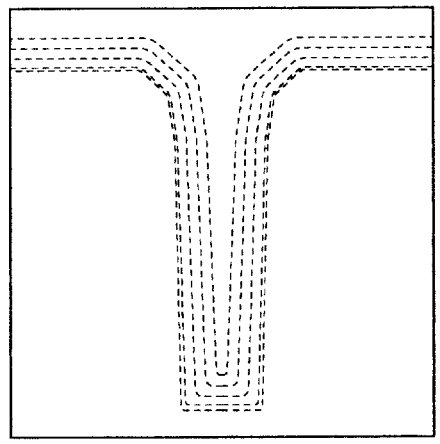
Figure 7B:
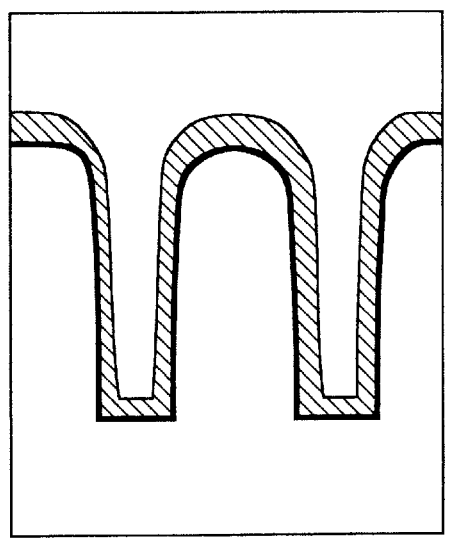

According to the present invention, when the additive concentration is 12 ppm, $0.01 \leq \Theta \leq 0.7$ is satisfied. On the other hand, at an additive concentration of 1 ppm, Θ=0.99 results, and hence the condition of the above-mentioned inequality is not satisfied, and preferential film growth from the bottom cannot be expected. In computational simulation (see FIGS. 6A and 6B) and in actual film forming experiments (see FIGS. 7A and 7B), also, it can be seen that whereas conformal filling alone takes place at an additive concentration of 1 ppm, preferential growth from the bottom takes place at an additive concentration of 12 ppm. It was revealed that, after completion of filling, seams generated at the former concentration whereas no seams generated at the latter concentration.

Thus, it is revealed that by selecting conditions which satisfy the inequality $0.01 \leq \Theta \leq 0.7$, preferential growth from the bottom can be attained and a seam-free filling becomes possible. Further, since the shapes obtained by experiments corresponded well to the results of analysis, the validity of prediction by simulation could be confirmed.

EXAMPLE 3

The filling shapes of the holes and trenches described below were calculated by computational simulation. The copper ion concentration, electric conductivity of the solvent, relation of current versus voltage, and current density were respectively the same as the experimental conditions of Example 1. The holes and trenches which were to be filled with copper plating metal had the following dimensions.

Hole: The hole had a radius at the bottom varied from 0.05 μm, and had a depth of 1.1 μm.

Trench: The trench had a width varied from 0.1 μm to 0.2 μm with an interval of about 0.02 μm and had a depth of 1.1 μm.

With regard to additive conditions, D/κ was calculated from 0.001 $h^2/w$ to 0.01 $h^2/w$ with an interval of 0.002 $h^2/w$, and from 0.01 $h^2/w$ to 1.0 $h^2/w$ with an interval of 0.01 $h^2/w$. Θ was calculated in the range of $0.01 \leq \Theta \leq 0.1$ with an interval of 0.01, and in the range of $0.1 < \Theta \leq 1.0$ with an interval of 0.1.

In the present Example, in the case of a hole, since the minimum radius is 0.05 μm, $h^2/w = 2.4 \times 10^{31\ 5}$ m results, so that attainment of seam-free filling can be expected in the ranges of $0.005 \times h^2/w (= 1.2 \times 10^{-7}\ m) < D/\kappa < 0.5 \times h^2/w (= 1.2 \times 10^{31\ 5}\ m)$ and $0.01 \leq \Theta \leq 0.7$.

Figure 1:
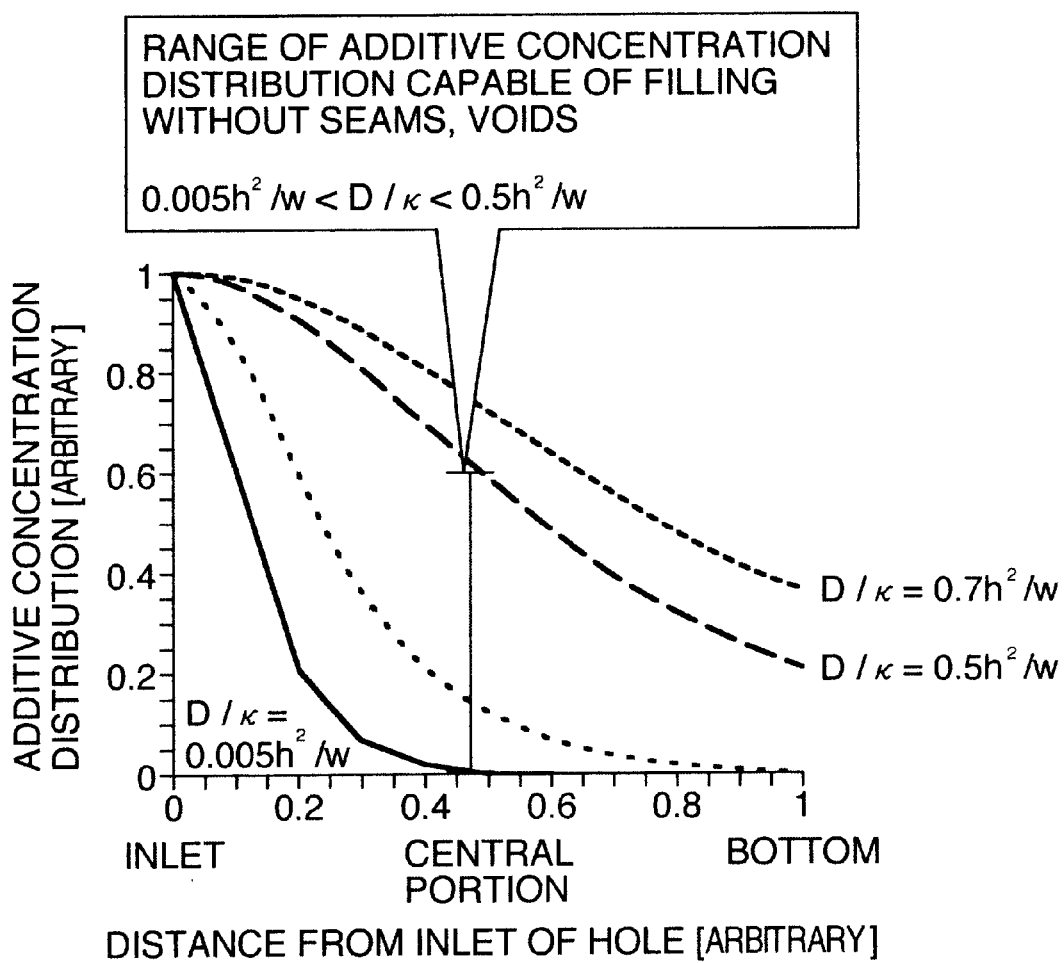
FIG. 1 is a graph showing the dependency of the additive concentration distribution on the ratio, D (diffusion coefficient of additive)/κ (surface reaction rate of additive), and the range of D/κ within which preferential growth from the bottom takes place at the time of plating, in one example of the present invention.
Figure 2:
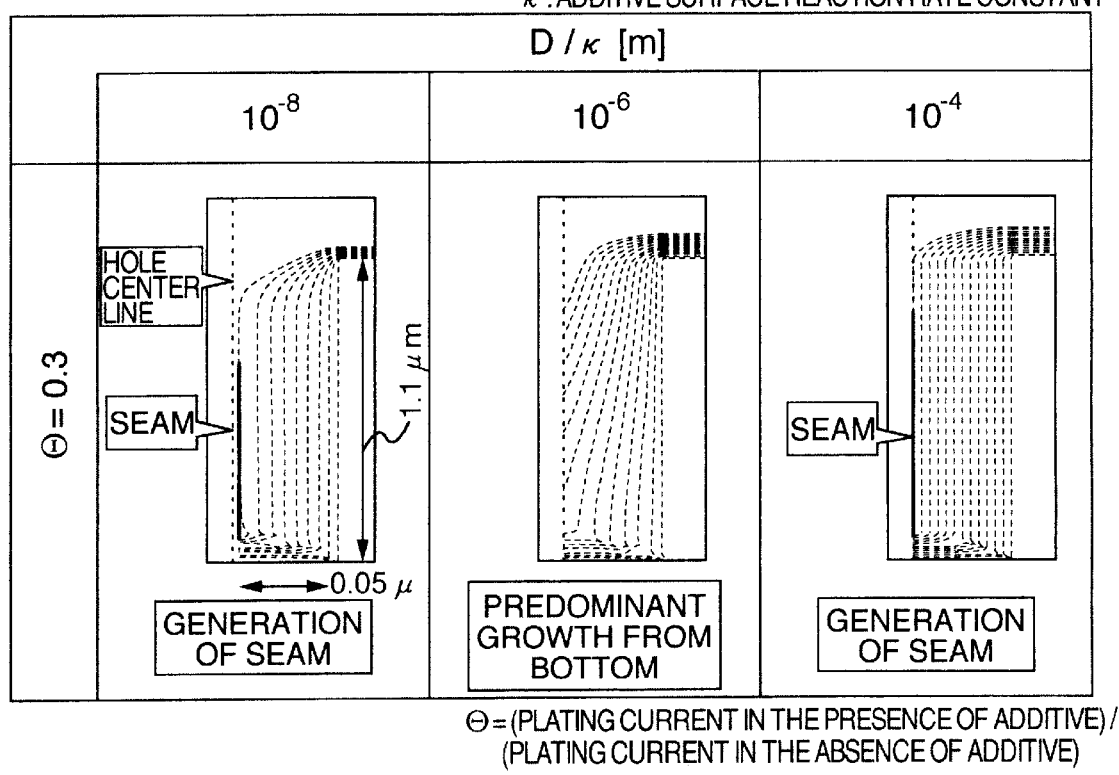
FIG. 2 is a drawing showing the dependency of the filling shape of a hole having a radius of 0.05 μm and a height of 1.1 μm on the ratio, D (diffusion coefficient of additive)/κ (surface reaction rate of additive), wherein Θ=(plating current in the presence of additive)/(plating current in the absence of additive)=0.3, in one example of the present invention.

In the case of a trench, since the minimum width is 0.1 μm, the conditions required in the present Example are: $0.005 \times h^2/w (= 0.6 \times 10^7 m) < D/\kappa < 0.5 \times h^2/w (= 0.6 \times 10^{-5} m)$ and $0.01 \leq \Theta \leq 0.7$. Some examples of the result of computation in actual simulation are shown in FIG. 2. FIG. 2 shows cases wherein, for a hole having a radius of 0.05 μm, D/κ is $10^{-8}$ m, $10^{-6}$ m and $10^{-4}$ m. In the present Example, only in the case of D/κ=$10^{-6}$ m, the condition $2.0 \times 10^{-7}$ m<D/κ<$2.0 \times 10^{-5}$ m is satisfied and the hole can be filled without generation of seams and voids. On the other hand, in the simulation shown in FIG. 2, also, it can be seen that seam-free and void-free filling can be attained also in the case of D/κ=$10^{-6}$ m alone and that seams generate when Dκ is $10^{-8}$ m and $10^{-4}$ m. Further, similar results were obtained also in the case of Θ=0.7 (see FIG. 3). From the results of entire computations, it was revealed that under the present conditions holes and trenches of 0.1 μm to 0.2 μm could be filled without seams and voids.

When the cases of D/κ=$10^{-6}$ m are compared between FIG. 3 and FIG. 2, it can be seen that the time necessary for complete filling till the central portion of the hole is shorter in the case of Θ=0.3 than in the case of Θ=0.7. From the results of similar computations, it has been revealed that the plating time necessary for complete filling till the central portion of the hole or trench is shorter at conditions of $0.05 \times h^2 w < D/\kappa < 0.2 \times h^2/w$ and $0.05 \leq \Theta \leq 0.3$ than at conditions of $0.005 \times h^2/w < D/\kappa < 0.5 \times h^2/w$ and $0.01 \leq \Theta \leq 0.1$. Therefore, when the minimum hole radius or the minimum trench width is 0.2 μm or less, the conditions of $0.05 \times h^2/w < D/\kappa < 0.2 \times h^2/w$ and $0.05 < \Theta < 0.3$ are more preferred due to the advantage of reduced plating filling time.

From the present computation, further, it has been revealed that when the minimum hole radius or trench width is 0.16 μm or less, the plating time necessary for complete filling till the central portion of the hole or trench is shorter at the condition of $0.07 \times h^2/w < D/\kappa < 0.1 \times h^2/w$ than at the condition of $0.05 \times h^2/w < D/\kappa < 0.2 \times h^2/w$. Therefore, when the hole radius or trench width is 0.16 μm or less, the condition of $0.07 \times h^2/w < D/\kappa < 0.1 \times h^2/w$ is still more preferred.

EXAMPLE 4

One example of application of the present invention to the actual production of a semiconductor device is described below with reference to FIG. 8 and FIG. 9. In a copper plating apparatus shown in FIG. 8, an anode 1 and a cathode provided with a semiconductor wafer 2 are rovided to oppose each other, and a plating solution 3 is circulated and stirred in the apparatus by means of a plating solution circulating motor 5. The plating conditions are the same as in Example 1. The current-voltage characteristics are controlled with an externally placed electric source controlling device 4. An apparatus 6 which serves for sampling the plating solution to determine its properties and supplementing an additive is provided midway in the circulation system of the plating solution.

Figure 9:
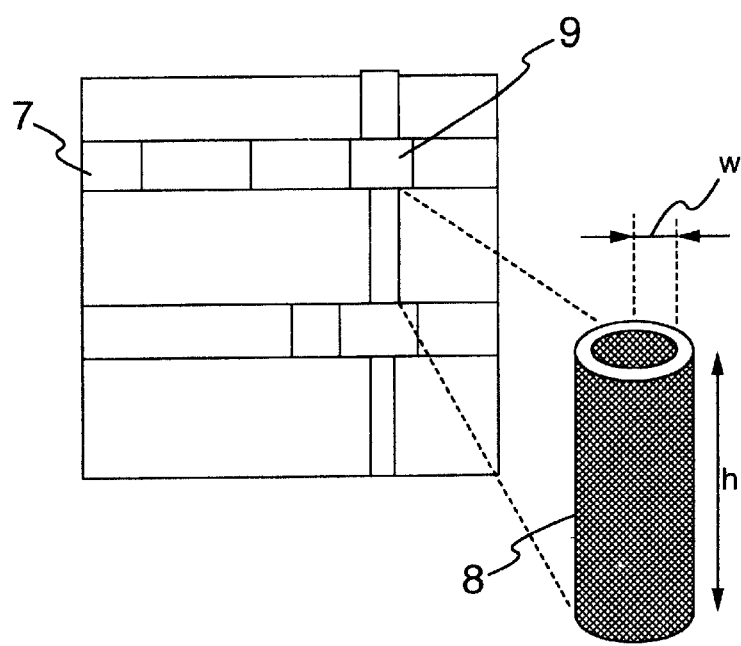
FIG. 9 is a schematic view showing copper wiring and a hole in application of the present invention to semiconductor production, in one example of the present invention.

An insulating material 7 on the semiconductor wafer in FIG. 9 is subjected to a film working technique, such as etching, to form a hole 8 and a wiring trench 9. In the hole is provided a seed layer of copper. Copper is plated into these holes and wiring trenches. In FIG. 9, h is the height of the hole to be filled with plating metal. In the Figure, w is the minimum radius of a hole to be filled with copper plating without seams and voids. The minimum radius throughout from the inlet to the bottom of a hole is w. Sometimes, the radius of the bottom face is taken as w. When the section of the hole is not a perfect circle, it is approximated with a radius of a circle having the same sectional area. By using a plating solution containing an additive and a film forming method which satisfy the conditions of $0.005 \times h^2/w < D\kappa < 0.5 \times h^2/w$ and $0.01 \leq \Theta \leq 0.7$, these holes and trenches can be filled without seams and voids.

At this time, a plating solution containing at least one additive selected from Janus Green B, Basic Blue 3, Diazine Black, Methyl Violet 2B, Tetranitro Blue Tetrazolium chloride hydrate, 2,3,5-Triphenyl-2H-tetrazolium chloride, Basic Red 12, Safranin O and cyanine dyes can be used. The range of distribution of these additives in the hole and trench is to be able to fill the hole and trench by copper plating without voids and seams. The semiconductor device in which the holes and wiring trenches have been filled with copper by utilizing the copper plating process using the plating solution has a lower resistance and improved operation speed as compared with previous devices using aluminum.

EXAMPLE 5

Figure 8:
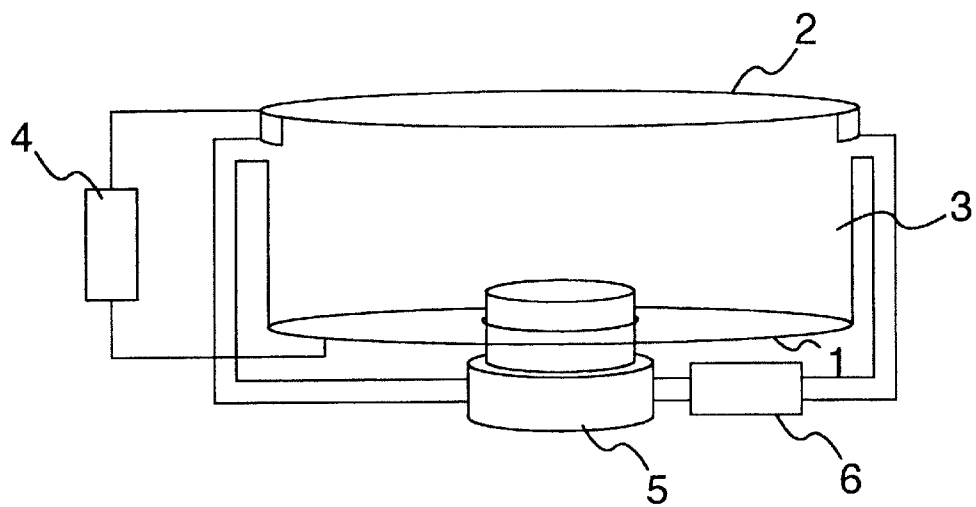
FIG. 8 is a schematic view of a copper plating apparatus used in application of the present invention to semiconductor production in one example of the present invention.

In the plating apparatus shown in FIG. 8, wherein the plating solution is in circulation, a part of the circulating plating solution is sampled continuously or intermittently by using the plating solution characteristic measuring and additive supplementing apparatus 6.

With the plating solution thus sampled, D, $\kappa$ and $\Theta$ are determined by the same methods as in the above-mentioned Examples. At this time, when $D\kappa$ and $\Theta$ have changed from the initially set values in the range of $0.005 \times h^2/w < D/\kappa < 0.5 \times h^2/w$ and $0.01 \leq \Theta \leq 0.7$, the values of $D/\kappa$ and $\Theta$ are returned to the initially set values by exchanging the plating solution containing the additive or supplementing the additive through the plating solution characteristic measuring and additive supplementing apparatus 6.

In this way, the change with time of the hole and wiring trench filling characteristics in the semiconductor device can be suppressed, and the reliability of the semiconductor device and the yield in semiconductor device production can be improved.

EXAMPLE 6

Figure 10:
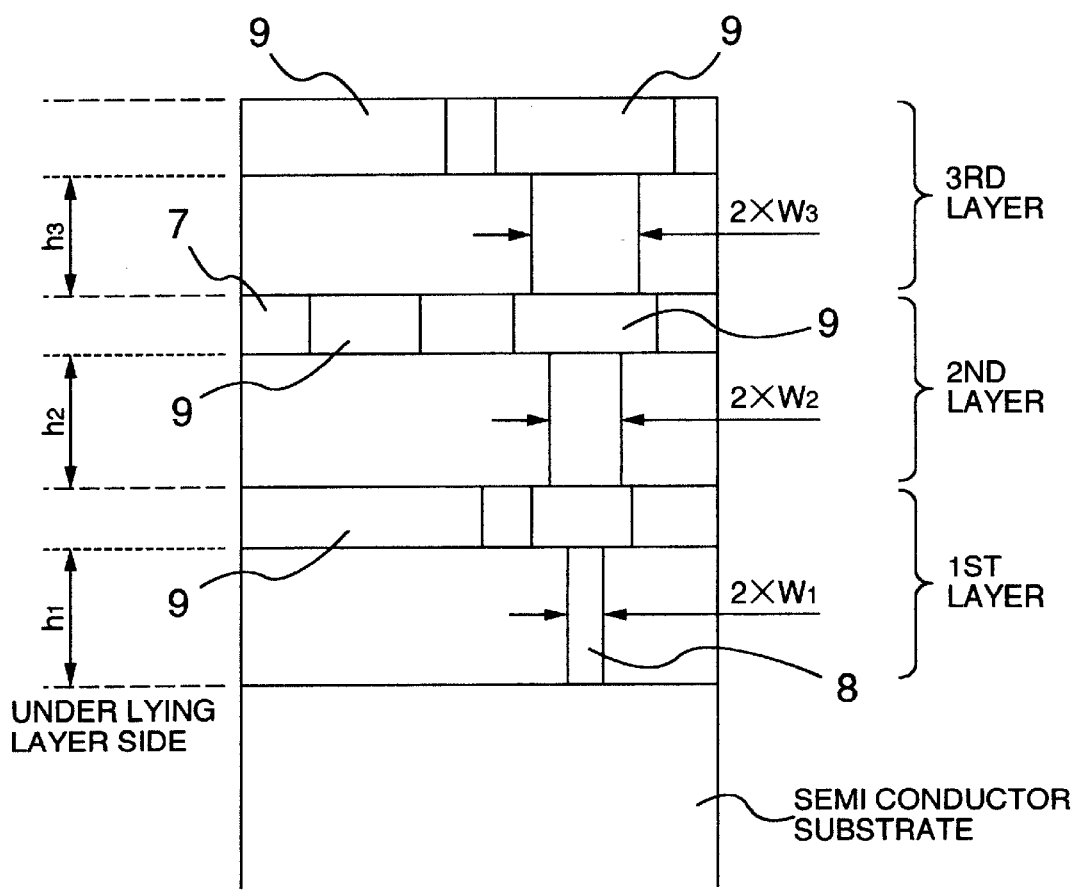
FIG. 10 is a schematic cross-sectional view of a semiconductor device having a multilayer structure according to one example of the present invention.

FIG. 10 shows a schematic cross-sectional view of a semiconductor device having a multilayer structure.

In this structure, the minimum radius of holes increases in upper layers. When the minimum radius of a hole 8 in a first layer is $w_1$, and the height of the hole is $h_1$, the minimum radius of a hole 8 in a second layer is $w_2$, and the height of the hole is $h_2$, and the minimum radius of a hole 8 in a third layer is $w_3$, and the height of the hole is $h_3$, there were used plating solutions having additives satisfying the following conditions in individual layers:

1st layer: $0.05 \times h_1^2/w_1 < D/\kappa < 0.2 \times h_1^2/w_1$

2nd layer: $0.05 \times h_2^2/w_2 < D/\kappa < 0.2 \times h_2^2/w_2$

3rd layer: $0.05 \times h_3^2/w_3 < D/\kappa < 0.2 \times h_3^2/w_3$

Needless to say, the additives and plating conditions used in individual layers are different. The plating conditions depend on at least one of compositions of plating solution, concentrations of additives and/or coper concentration in the plating solution, current density, and flow rate of plating solution. These conditions effect on the value of $D/\kappa$.

By this, it is possible to produce a semiconductor device more excellent in filling properties in individual layers compared with the case of using one kind of plating solution.

The semiconductor device obtained in this Example has copper wirings insulated by an insulating material 7 and filled in wiring trenches 9 on the semiconductor substrate. That is, there are a plurality of copper wiring layers on the semiconductor substrate. Further, since the plating condition is different in each layer, at least one copper wiring layer is different from the rest of copper wiring layers in an element and/or proportion (or amount ratio) thereof contained in the copper wiring. The amount ratio of elements can be obtained by observing elements by using a secondary ion mass spectroscopy (SIMS), wherein elements such as C, O, N, Cu, S, P, H, B, F, Cl, and Si can be observed. Further, in each copper wiring layer, since the range of minimum aspect ratio changes, it is required to conduct the most suitable copper plating process in each copper wiring layer.

In the semiconductor device obtained in this Example, generation of voids or seams can be prevented in each wiring layer, resulting in improving electrical properties and reliability of the semiconductor device.

EXAMPLE 7

In filling a plating metal comprising at least one metal selected from copper, silver, gold, ruthenium (Ru), platinum, nickel, iron and cobalt into a hole or a trench without generating seams and voids, a plating solution containing an additive which satisfies the conditions of $0.005 \times h^2/w < D/\kappa < 0.5 \times h^2/w$ and $0.01 \leq \Theta \leq 0.7$ is used, and a plating method using the plating solution is utilized for producing a semiconductor device.

As described above, in a process of forming a plating film on a substrate having a trench with a height h and width w or a hole with a radius w, a material which hinders the film formation when added (additive) and a film forming process which satisfy the following two inequalities simultaneously are used:

$$0.005 \times h^2/w < D/\kappa < 0.5 \times h^2/w \text{ and}$$

and $$0.01 \leq \Theta \leq 0.7$$

D being the diffusion coefficient (m²/sec) of the additive, $\kappa$ being the reaction rate (m/sec) of adsorption or consumption of the additive at the surface, $D/\kappa$ being the ratio of the two, and $\Theta$ being the ratio, (film growth rate in the presence of additive)/(film growth rate in the absence of additive, at the same plating potential.

In this way, in the plating process for semiconductors, an additive and a film forming process can be provided which permit preferential proceeding of plating without generating voids in a trench having a width of 1 μm or less or a hole having a radius of 1 μm or less.

According to the present invention, there can be provided, in a copper plating process for semiconductors, a plating solution, plating method and semiconductor production process which permit preferential proceeding of plating and generate no seams or voids in a trench having a width of 1 μm or less or a hole having a radius of 1 μm or less.

According to the present invention, further, in a copper plating process for semiconductors, by monitoring continuously or intermittently the diffusion coefficient (D) of the additive, surface reaction rate ($\kappa$) thereof and the ratio (plating current in the presence of additive)/(plating current in the absence of additive)=$\Theta$ and controlling the amount of the additive supplied so that $D/\kappa$ and $\Theta$ may fall within specified ranges respectively, the change of filling characteristics with the lapse of time can be suppressed and desirable filling characteristics can be maintained.

By utilizing copper plated by using the plating solution and plating method wherein the above-mentioned additive is used as holes and wiring, lower wiring resistance can be attained as compared with prior art aluminum wiring. As a result, the operation speed of the next generation semiconductor device can be enhanced.

What is claimed is:

1. A plating method which comprises adding an additive which hinders growth of plating metal film to a plating solution so as to satisfy the following conditions:

$$0.005 \times h^2/w < D/\kappa < 0.5 \times h^2/w$$

wherein D is a diffusion coefficient (m²/sec) of the additive; κ is a surface reaction rate (m/sec) of adsorption or consumption of the additive; h is a height (m) of a trench or hole; and w is the minimum width (m) of the trench or the minimum radius (m) of the hole, and $$0.01 \leq \Theta \leq 0.7$$

wherein Θ is a ratio of (plating film growth rate in the presence of additive)/(plating film growth rate in the absence of additive), or (plating current in the presence of additive)/(plating current in the absence of additive) at the same plating potential, in the case of filling the trench having the minimum width of $10^{-6}$ m or less, or the hole having the minimum radius of $10^{-6}$ m or less, and forming the plating metal in the trench or hole.

2. A method according to claim 1, wherein the minimum width of the trench is $0.2 \times 10^{-6}$ m or less, or the minimum radius of the hole is $0.2 \times 10^{-6}$ m or less, and the additive is added to the plating solution to satisfy the following condition:

$$0.05 \times h^2/w < D/\kappa < 0.2 \times h^2/w$$

wherein D, κ, h and w are as defined in claim 1.

3. A method according to claim 1, wherein the minimum width of the trench is $0.2 \times 10^{-6}$ m or less, or the minimum radius of the hole is $0.2 \times 10^{-6}$ m or less, and the additive is added to the plating solution to satisfy the following condition:

$$0.05 \leq \Theta \leq 0.3.$$

4. A method according to claim 1, wherein the amount of the additive added to the plating solution is adjusted to satisfy the following conditions:

$$0.005 \times h^2/w < D/\kappa < 0.5 \times h^2/w;$$

and $$0.01 \leq \Theta \leq 0.7$$

wherein D, κ, h, w and Θ are as defined in claim 1, by monitoring the values of D, κ and Θ.

5. A method according to claim 1, wherein the value of κ is determined based on an electrochemical reaction rate of the additive on an electrode surface constituted by the metal plated.

6. In a process for producing a semiconductor device comprising a step of forming a plating metal in a trench having the minimum width (w) of $10^{-6}$ m or less, or a hole having the minimum radius (w) of $10^{-6}$ m or less, the improvement wherein there is used a plating solution containing an additive which satisfies the following conditions:

$$0.005 \times h^2/w < D/\kappa < 0.5 \times h^2/w$$

wherein D is a diffusion coefficient (m²/sec) of the additive; κ is a surface reaction rate (m/sec) of adsorption or consumption of the additive; h is a height (m) of the trench or hole; and w is the minimum width (m) of the trench or the minimum radius (m) of the hole, and $$0.01 \leq \Theta \leq 0.7$$

wherein Θ is a ratio of (plating film growth rate in the presence of additive)/(plating film growth rate in the absence of additive), or (plating current in the presence of additive)/(plating current in the absence of additive), at the same plating potential.

7. A process for producing a semiconductor device having a multilayer structure, which comprises forming a plurality of copper wiring layers on a semiconductor substrate, each copper wiring layer having different minimum width of a trench or minimum radius of a hole and being formed respectively by using a plating solution containing an additive which satisfies the following conditions:

$$0.05 \times h^2/w < D/\kappa < 0.2 \times h^2/w$$

wherein D is a diffusion coefficient (m²/sec) of the additive; κ is a surface reaction rate (m/sec) of adsorption or consumption of the additive; h is a height (m) of a trench or hole in each layer; and w is the minimum width (m) of the trench or the minimum radius (m) of the hole in each layer.

* * * * *